US008523387B2

(12) United States Patent
Anderson et al.

(10) Patent No.: US 8,523,387 B2
(45) Date of Patent: Sep. 3, 2013

(54) COLLECTION OPTICS FOR LED ARRAY WITH OFFSET HEMISPHERICAL OR FACETED SURFACES

(75) Inventors: Duwayne R. Anderson, Saint Helens, OR (US); Roland Jasmin, Jr., Lake Oswego, OR (US)

(73) Assignee: Phoseon Technology, Inc., Hillsboro, OR (US)

( * ) Notice: Subject to any disclaimer, the term of this patent is extended or adjusted under 35 U.S.C. 154(b) by 374 days.

(21) Appl. No.: 12/893,405

(22) Filed: Sep. 29, 2010

(65) Prior Publication Data

US 2011/0063840 A1    Mar. 17, 2011

Related U.S. Application Data

(63) Continuation of application No. 10/577,514, filed as application No. PCT/US2004/036260 on Oct. 28, 2004, now Pat. No. 7,819,550.

(60) Provisional application No. 60/516,382, filed on Oct. 31, 2003.

(51) Int. Cl.
    *F21V 1/00* (2006.01)
(52) U.S. Cl.
    USPC ............................. 362/235; 362/236; 362/237
(58) Field of Classification Search
    USPC .................................................. 362/235–237
    See application file for complete search history.

(56) References Cited

U.S. PATENT DOCUMENTS

| 3,586,959 | A | 6/1971 | Eccles et al. |
| 3,936,686 | A | 2/1976 | Moore |
| 4,011,575 | A | 3/1977 | Groves |
| 4,118,873 | A | 10/1978 | Rothchild |
| 4,435,732 | A | 3/1984 | Hyatt |
| 4,530,040 | A | 7/1985 | Petterson |
| 4,544,642 | A | 10/1985 | Maeda et al. |
| 4,595,289 | A | 6/1986 | Feldman et al. |
| 4,603,496 | A | 8/1986 | Latz et al. |
| 4,684,801 | A | 8/1987 | Carroll et al. |
| 4,685,139 | A | 8/1987 | Masuda et al. |
| 4,734,714 | A | 3/1988 | Takasu et al. |

(Continued)

FOREIGN PATENT DOCUMENTS

| DE | 8815418.1 U1 | 2/1989 |
| DE | 19619154 A1 | 6/1997 |

(Continued)

OTHER PUBLICATIONS

ISA European Patent Office, Supplementary European Search Report of EP03724539, Nov. 21, 2007, Germany, 8 pages.

(Continued)

*Primary Examiner* — Diane Lee
*Assistant Examiner* — Sean Gramling
(74) *Attorney, Agent, or Firm* — Alleman Hall McCoy Russell & Tuttle LLP

(57) ABSTRACT

An array of LEDs is provided having a lens array for collecting divergent light from each LED. Each lens in the array is associated with a respective LED and has a compound shape including a curved surface that may be spherical or may have an offset aspherical shape. The curved surfaces are centered about each side of its associated LED. The lens may alternatively include faceted surfaces that approximate the curved lens surface.

18 Claims, 5 Drawing Sheets

(56) References Cited

U.S. PATENT DOCUMENTS

| | | |
|---|---|---|
| 4,935,665 A | 6/1990 | Murata |
| 5,003,357 A | 3/1991 | Kim et al. |
| 5,018,853 A | 5/1991 | Hechel et al. |
| 5,150,623 A | 9/1992 | Woods |
| 5,195,102 A | 3/1993 | McLean et al. |
| 5,296,724 A | 3/1994 | Ogata et al. |
| 5,397,867 A | 3/1995 | Demeo |
| 5,418,384 A | 5/1995 | Yamana et al. |
| 5,424,544 A | 6/1995 | Shelton et al. |
| 5,436,710 A | 7/1995 | Uchiyama |
| 5,490,049 A | 2/1996 | Montalan et al. |
| 5,522,225 A | 6/1996 | Eskandari |
| 5,554,849 A | 9/1996 | Gates |
| 5,555,038 A | 9/1996 | Conway |
| 5,623,510 A | 4/1997 | Hamilton et al. |
| 5,632,551 A | 5/1997 | Roney et al. |
| 5,660,461 A | 8/1997 | Ignatius et al. |
| 5,698,866 A | 12/1997 | Doiron et al. |
| 5,715,270 A | 2/1998 | Zediker et al. |
| 5,719,589 A | 2/1998 | Norman et al. |
| 5,806,965 A | 9/1998 | Deese |
| 5,857,767 A | 1/1999 | Hochstein |
| 5,877,899 A | 3/1999 | Stern et al. |
| 5,880,828 A | 3/1999 | Nakamura et al. |
| 5,886,313 A | 3/1999 | Krause et al. |
| 5,892,579 A | 4/1999 | Elyasaf et al. |
| 5,910,706 A | 6/1999 | Stevens et al. |
| 6,033,087 A | 3/2000 | Shozo et al. |
| 6,045,240 A | 4/2000 | Hochstein |
| 6,058,012 A | 5/2000 | Cooper et al. |
| 6,065,854 A | 5/2000 | West et al. |
| 6,088,185 A | 7/2000 | Ratliff et al. |
| 6,115,184 A | 9/2000 | Hubble, III et al. |
| 6,118,383 A | 9/2000 | Hegyi |
| 6,141,040 A | 10/2000 | Toh |
| 6,155,699 A | 12/2000 | Miller et al. |
| 6,163,036 A | 12/2000 | Taninaka et al. |
| 6,200,134 B1 | 3/2001 | Kovac et al. |
| 6,252,351 B1 | 6/2001 | Koizumi et al. |
| 6,273,596 B1 | 8/2001 | Parkyn, Jr. |
| 6,290,382 B1 | 9/2001 | Bourn et al. |
| 6,291,839 B1 | 9/2001 | Lester |
| 6,318,886 B1 | 11/2001 | Stopa et al. |
| 6,319,425 B1 | 11/2001 | Tasaki et al. |
| 6,325,524 B1 | 12/2001 | Weber et al. |
| 6,328,456 B1 * | 12/2001 | Mize ................ 362/311.02 |
| 6,330,017 B1 | 12/2001 | Suzuki |
| 6,346,771 B1 | 2/2002 | Salam |
| 6,366,017 B1 | 4/2002 | Antoniadis et al. |
| 6,367,950 B1 | 4/2002 | Yamada et al. |
| 6,373,635 B1 | 4/2002 | Fujimoto et al. |
| 6,375,340 B1 | 4/2002 | Biebl et al. |
| 6,419,384 B1 | 7/2002 | Lewis et al. |
| 6,420,199 B1 | 7/2002 | Coman et al. |
| 6,439,888 B1 | 8/2002 | Boutoussov et al. |
| 6,450,664 B1 | 9/2002 | Kelly |
| 6,457,823 B1 | 10/2002 | Cleary et al. |
| 6,459,919 B1 | 10/2002 | Lys et al. |
| 6,480,389 B1 | 11/2002 | Shie et al. |
| 6,498,355 B1 | 12/2002 | Harrah et al. |
| 6,501,084 B1 | 12/2002 | Sakai et al. |
| 6,525,335 B1 | 2/2003 | Krames et al. |
| 6,534,791 B1 | 3/2003 | Hayashi et al. |
| 6,536,923 B1 | 3/2003 | Merz |
| 6,541,800 B2 | 4/2003 | Barnett et al. |
| 6,547,249 B2 | 4/2003 | Collins, III et al. |
| 6,554,451 B1 | 4/2003 | Keuper |
| 6,561,640 B1 | 5/2003 | Young |
| 6,561,808 B2 | 5/2003 | Neuberger |
| 6,570,324 B1 * | 5/2003 | Tutt et al. ................ 313/500 |
| 6,573,536 B1 | 6/2003 | Dry |
| 6,577,332 B2 | 6/2003 | Osawa et al. |
| 6,578,986 B2 | 6/2003 | Swaris et al. |
| 6,578,989 B2 | 6/2003 | Osumi et al. |
| 6,607,286 B2 | 8/2003 | West et al. |
| 6,630,689 B2 | 10/2003 | Bhat et al. |
| 6,683,421 B1 | 1/2004 | Kennedy et al. |
| 6,686,581 B2 | 2/2004 | Verhoeckx et al. |
| 6,692,250 B1 | 2/2004 | Decaudin et al. |
| 6,708,501 B1 | 3/2004 | Ghoshal et al. |
| 6,724,473 B2 | 4/2004 | Leong et al. |
| 6,746,295 B2 | 6/2004 | Sorg |
| 6,759,803 B2 | 7/2004 | Sorg |
| 6,796,698 B2 | 9/2004 | Sommers et al. |
| 6,800,500 B2 | 10/2004 | Coman et al. |
| 6,815,724 B2 | 11/2004 | Dry |
| 6,822,991 B2 | 11/2004 | Collins, III et al. |
| 6,831,303 B2 | 12/2004 | Dry |
| 6,834,963 B2 | 12/2004 | Kim et al. |
| 6,836,081 B2 | 12/2004 | Swanson et al. |
| 6,850,637 B1 | 2/2005 | Burnett |
| 6,857,767 B2 | 2/2005 | Matsui et al. |
| 6,880,954 B2 | 4/2005 | Ollett et al. |
| 6,882,331 B2 | 4/2005 | Wu |
| 6,930,870 B2 | 8/2005 | Nobe et al. |
| 6,937,754 B1 | 8/2005 | Eguchi |
| 6,992,335 B2 | 1/2006 | Ohkawa |
| 6,995,348 B2 | 2/2006 | Bradley et al. |
| 6,995,405 B2 | 2/2006 | Braddell et al. |
| 7,009,165 B2 | 3/2006 | Hehemann et al. |
| 7,071,493 B2 | 7/2006 | Owen et al. |
| 7,102,172 B2 | 9/2006 | Lynch et al. |
| 7,179,670 B2 | 2/2007 | Shelton et al. |
| 2001/0002120 A1 | 5/2001 | Bessendorf et al. |
| 2001/0030782 A1 | 10/2001 | Trezza |
| 2001/0046652 A1 | 11/2001 | Ostler et al. |
| 2002/0187454 A1 | 12/2002 | Melikechi et al. |
| 2003/0038943 A1 | 2/2003 | Almarzouk et al. |
| 2003/0043582 A1 | 3/2003 | Chan et al. |
| 2003/0081096 A1 | 5/2003 | Young |
| 2003/0209714 A1 | 11/2003 | Taskar et al. |
| 2003/0230765 A1 | 12/2003 | Dry |
| 2004/0000677 A1 | 1/2004 | Dry |
| 2004/0011457 A1 | 1/2004 | Kobayashi et al. |
| 2004/0026721 A1 | 2/2004 | Dry |
| 2004/0041521 A1 | 3/2004 | Mandler et al. |
| 2004/0057873 A1 | 3/2004 | Yerazunis et al. |
| 2004/0090794 A1 | 5/2004 | Ollett et al. |
| 2004/0113549 A1 | 6/2004 | Roberts et al. |
| 2004/0119084 A1 | 6/2004 | Hsieh et al. |
| 2004/0134603 A1 | 7/2004 | Kobayashi et al. |
| 2004/0135159 A1 | 7/2004 | Siegel |
| 2004/0141326 A1 | 7/2004 | Dry |
| 2004/0166249 A1 | 8/2004 | Siegel |
| 2004/0195947 A1 | 10/2004 | Clark et al. |
| 2004/0201995 A1 | 10/2004 | Galli |
| 2004/0206970 A1 | 10/2004 | Martin |
| 2004/0238111 A1 | 12/2004 | Siegel |
| 2005/0087750 A1 | 4/2005 | Braddell et al. |
| 2005/0098299 A1 | 5/2005 | Goodson et al. |
| 2005/0152146 A1 | 7/2005 | Owen et al. |
| 2005/0218468 A1 | 10/2005 | Owen et al. |
| 2005/0230600 A1 | 10/2005 | Olson et al. |
| 2005/0231713 A1 | 10/2005 | Owen et al. |
| 2005/0253252 A1 | 11/2005 | Owen et al. |
| 2005/0285129 A1 | 12/2005 | Jackson, III et al. |
| 2006/0216865 A1 | 9/2006 | Owen et al. |
| 2007/0030678 A1 | 2/2007 | Bedson et al. |
| 2007/0051964 A1 | 3/2007 | Owen et al. |
| 2007/0154823 A1 | 7/2007 | Marson et al. |
| 2007/0278504 A1 | 12/2007 | Jasmin et al. |

FOREIGN PATENT DOCUMENTS

| | | |
|---|---|---|
| DE | 10127171 A1 | 12/2001 |
| EP | 0146998 A1 | 7/1985 |
| EP | 0879582 A1 | 11/1998 |
| EP | 0935145 A1 | 8/1999 |
| EP | 1158761 A1 | 11/2001 |
| EP | 1467416 A2 | 10/2004 |
| EP | 1469529 A2 | 10/2004 |
| EP | 1502752 A2 | 2/2005 |
| EP | 1526581 A2 | 4/2005 |
| GB | 2224374 A | 5/1990 |
| GB | 2396331 A | 6/2004 |

| | | | |
|---|---|---|---|
| GB | 2399162 A | 9/2004 | |
| JP | 404204333 A | 7/1992 | |
| JP | 2003268042 A | 9/2003 | |
| JP | 2004198536 A | 7/2004 | |
| JP | 2004297052 A | 10/2004 | |
| WO | 9507731 A1 | 3/1995 | |
| WO | 9716679 A1 | 5/1997 | |
| WO | 9854227 A2 | 12/1998 | |
| WO | 0037904 A1 | 6/2000 | |
| WO | 0059671 A1 | 10/2000 | |
| WO | 0067048 A2 | 11/2000 | |
| WO | 0102846 A1 | 1/2001 | |
| WO | 0206723 A1 | 1/2002 | |
| WO | 0211640 A2 | 2/2002 | |
| WO | 0213231 A2 | 2/2002 | |
| WO | 0226270 A2 | 4/2002 | |
| WO | 02069839 A1 | 9/2002 | |
| WO | 03023875 A2 | 3/2003 | |
| WO | 2004009318 A1 | 1/2004 | |
| WO | 2004011848 A2 | 2/2004 | |
| WO | 2004038759 A2 | 5/2004 | |
| WO | 2004049462 A1 | 6/2004 | |
| WO | 2004078477 A1 | 9/2004 | |
| WO | 2004084316 A2 | 9/2004 | |
| WO | 2004097516 A2 | 11/2004 | |
| WO | 2004097947 A2 | 11/2004 | |
| WO | 2004100343 A2 | 11/2004 | |
| WO | 2005036054 A1 | 4/2005 | |
| WO | 2005043598 A2 | 5/2005 | |
| WO | 2005043954 A2 | 5/2005 | |
| WO | 2005091392 A1 | 9/2005 | |
| WO | 2006072071 A2 | 7/2006 | |

OTHER PUBLICATIONS

ISA U.S., International Search Report of PCT/US03/14625, Nov. 19, 2003, WIPO, 6 pages.
ISA U.S., International Search Report of PCT/US04/36046, Jun. 7, 2006, WIPO, 7 pages.
ISA U.S., International Search Report of PCT/US05/09407, Aug. 26, 2005, WIPO, 11 pages.
ISA U.S., International Search Report of PCT/US04/36370, Jun. 17, 2005, WIPO, 6 pages.
ISA U.S., International Preliminary Report on Patentability of PCT/US2004/036260, May 1, 2006, 4 pages.
ISA U.S., International Search Report and Written Opinion of PCT/US05/09076, Oct. 16, 2006, 11 pages.
ISA U.S., International Search Report and Written Opinion of PCT/US05/11216, Sep. 28, 2006, 9 pages.
ISA U.S., International Search Report and Written Opinion of PCT/US05/12608, Feb. 6, 2007, 9 pages.
ISA U.S., International Search Report and Written Opinion of PCT/US05/13448, Oct. 13, 2006, 9 pages.
ISA U.S., International Search Report and Written Opinion of PCT. US05/47605, Feb. 27, 2008, 9 pages.
"Electromagnetic Spectrum," Gregory C. Finn, http://www.brocku.ca/earthsciences/people/ginn/optical/spectrum.gif, Accessed Aug. 16, 2006, 1 page.
Siegel, Stephen, "Curing with UV LED's," IS&T's NIP 19: 2003 International Conference on Digital Printing Technologies; RadTech, Screen Printing Association USA; Sep. 2003, 1 page.
Data Sheet for G*SiC Technology Super Blue LEDs No. C430-CB290-E1200, manufactured by Opto Semiconductors, May 1, 1999, 8 pages.
Data Sheet for 5.0 mm Blue Series LEDs No. LNG992CFB, manufactured by the Panasonic Corporation, Mar. 2001, 1 page.
Data Sheet for 3.0 mm Blue Series LEDs No. LNG997CKB, manufactured by the Panasonic Corporation, Mar. 2001, 1 page.
Data Sheet for G*SiC Technology Ultraviolet LEDs No. C395-MB290-E0400, manufactured by Cree, Inc., 2 pages.

* cited by examiner

COLLECTION OPTICS FOR LED ARRAY WITH OFFSET HEMISPHERICAL OR FACETED SURFACES

CROSS-REFERENCE TO RELATED APPLICATIONS

This is a Continuation of co-pending U.S. patent application Ser. No. 10/577,514, filed Apr. 27, 2006, entitled COLLECTION OPTICS FOR LED ARRAY WITH OFFSET HEMISPHERICAL OR FACETED SURFACES, which is a national phase application and claims the benefit of PCT Application No. PCT/US2004/036260, filed Oct. 28, 2004, entitled COLLECTION OPTICS FOR LED ARRAY WITH OFFSET HEMISPHERICAL OR FACETED SURFACES, which claims the benefit of U.S. Provisional Application No. 60/516,382, filed Oct. 31, 2003, entitled COLLECTION OPTICS FOR LED ARRAY WITH OFFSET HEMISPHERICAL OR FACETED SURFACES, the disclosure of which is herein incorporated by reference in its entirety.

BACKGROUND OF THE INVENTION

Solid state lighting devices such as, for example, light emitting diodes (LEDs) are used for a number of applications. One type of such solid state lighting device is disclosed in International Patent Application No. PCT/US03/14625, filed May 28, 2003, entitled High Efficiency Solid-State Light Source And Methods Of Use And Manufacture, the details of which are hereby incorporated by reference.

Arrays of light-emitting diodes (LEDs) are used for many purposes. For example, arrays of LEDs are sometimes used in conjunction with arrays of lenses. The lens arrays are used to collect and collimate the light from the array of LEDs. However, since the light from LEDs emits into a wide range of angles, there is often a need to collect the light and project it more usefully. For example, as seen in FIG. 1, au array 10 of such light sources 12, such as, for example, LEDs are sometimes used with an array of lenses 14. Such lens arrays 14 are typically mounted above the LED array 10 and are used to collect and collimate the light from the LED array 10. The simplest and most common lens shape has a spherical surface to it, as shown in FIG. 1. The problem with the configuration in FIG. 1 is that the spherical design of each lens 16 assumes that the LED 12 is a point source of light. However, in reality LEDs are not point sources of light. Rather, LEDs project distributed light in a wide range of angles.

FIG. 2 shows a more accurate depiction of light emitted from an LED array 18. FIG. 2 shows that LEDs 20 often emit light from their sides, in which case the light is distributed and each LED 20 actually looks more lice two closely spaced sources of light, rather than a single point source. Therefore, for some types of light sources, a single spherical lens 22 is an inadequate optic because it does not adequately gather or collect the disparate light so that it is more usefully projected. This makes the simple plano-convex lens an inappropriate shape for efficiently collecting and directing the light from such LED sources. In order to adequately collect such disparate light, two or more lenses would be required for each light source or LED.

In order to overcome the above-described problems, some light sources include a focusing optic that has an aspherical surface to collect disparate light firm a source. The configuration of the aspherical surface for any given application may be determined, for example, by using typical lens makers equations know to those skilled in the art. Thus, the optimal aspheric shape for a collimating optic used with a highly divergent source such as an LED may be calculated. Aspherical surfaces are a well-established means of collimating the light from highly divergent sources. However, aspherical optics are complex and often too expensive and/or require expensive tooling to be practical. Even spherical lens arrays can be too expensive to manufacture for some low-cost, high-volume applications.

Examples of these various means of collimating the light from and LED are found in the following U.S. Patents to Marshall et al (U.S. Pat. No. 6,547,423), Wu (U.S. Pat. No. 6,502,956), and Suzuki (U.S. Pat. No. 6,330,017), the details of which are herein incorporated by reference.

What is needed is a low-cost optic for a highly distributed and divergent light source that collects the light so that it is projected in a concentrated beam.

Additionally, what is needed is a low-cost solution for approximating complex optical surfaces to give adequate collection efficiency for arrays of light sources for lighting (non-imaging) applications.

SUMMARY OF THE INVENTION

In one aspect of the present invention, a lens array for use with an array of LEDs is provided in which each lens has a compound shape, but is still constructed of curved surfaces. Since each side of the LED emits primarily into the curved hemisphere on that side, each side of the LED emits light that primarily transmits through what looks like a plano-convex lens centered over that side. This means that the geometry of the curved surfaces is optimized for each portion of the LED from which it collects light. Therefore, only one lens may be used for each light source or LED.

Another aspect of this invention uses cut facets to approximate the shape of either a spherical or an aspheric surface. These facets may be machined into a tool that works like a drill bit, or they may be machined by a router or grinder. When used in conjunction with a custom drill bit, the faceted angles will lie on a circularly symmetric surface. When used in conjunction with a router or grinder, the facets can be used to build tiered structures, such as micro-pyramids, in, for example, a square tile pattern that fully fills the surface. The faceted approach can accommodate flattened shapes necessitated in this case by the fact that the LED has two facets on either side of its extended width.

While not intended for imaging applications, this approach is an inexpensive way of improving the collection efficiency of the optic.

A lens array is provided for collecting light from a light source in which the light source emits divergent light. At least one lens is provided having a compound shape including curved surfaces that are centered about each side of the light source. The curved surface may be spherical or may have an offset aspheric shape. The lens may include a flat top portion separating the curved surfaces with the curved surfaces being equidistant from a center line extending through the light source. The lens includes geometry that is optimized for each portion of the light source from which that section of the lens collects light.

The lens may include an approximated aspheric shape that includes faceted surfaces that approximates an aspheric shape. The faceted surfaces may be formed to have a symmetrically circular shape by a tool, such as, for example, a drill bit. Alternatively, the faceted surface may be formed of micro-pyramids forming a square tile pattern by a tool, such as, for example, a surface lathe or grinder.

These and other embodiments are described in more detail in the following detailed descriptions and the figures.

The foregoing is not intended to be an exhaustive list of embodiments and features of the present invention. Persons skilled in the art are capable of appreciating other embodiments and features from the following detailed description in conjunction with the drawings.

DETAILED DESCRIPTION OF THE INVENTION

Figure 1:
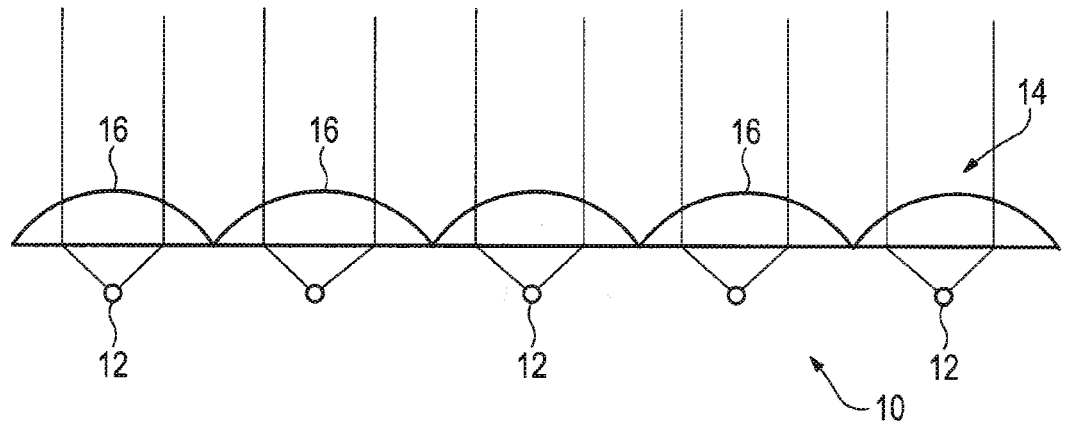
FIG. 1 is a view of a typical point source light array with simple plano-convex lenses having spherical surface profiles a point source of light.
Figure 2:
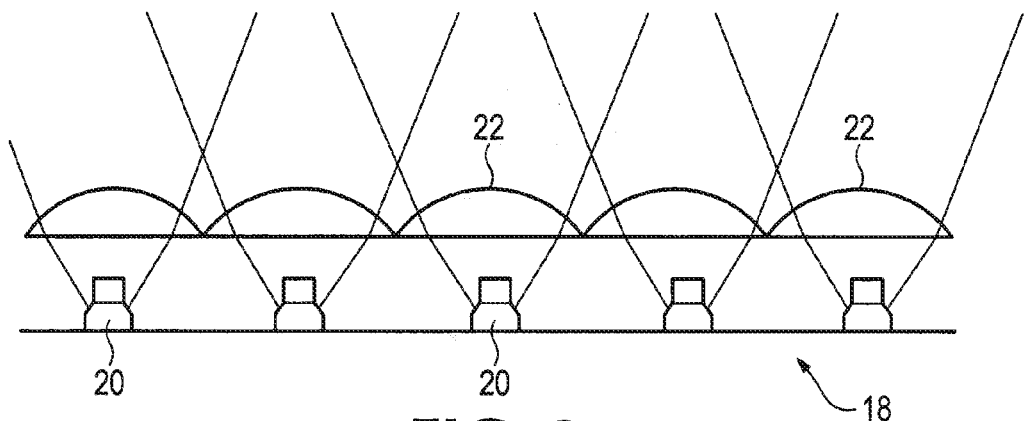
FIG. 2 is a view of a typical LED array emitting widely disparate light with simple plano-convex lenses.

Representative embodiments of the present invention are shown in FIGS. 3-7, wherein similar features share common reference numerals.

Figure 3:
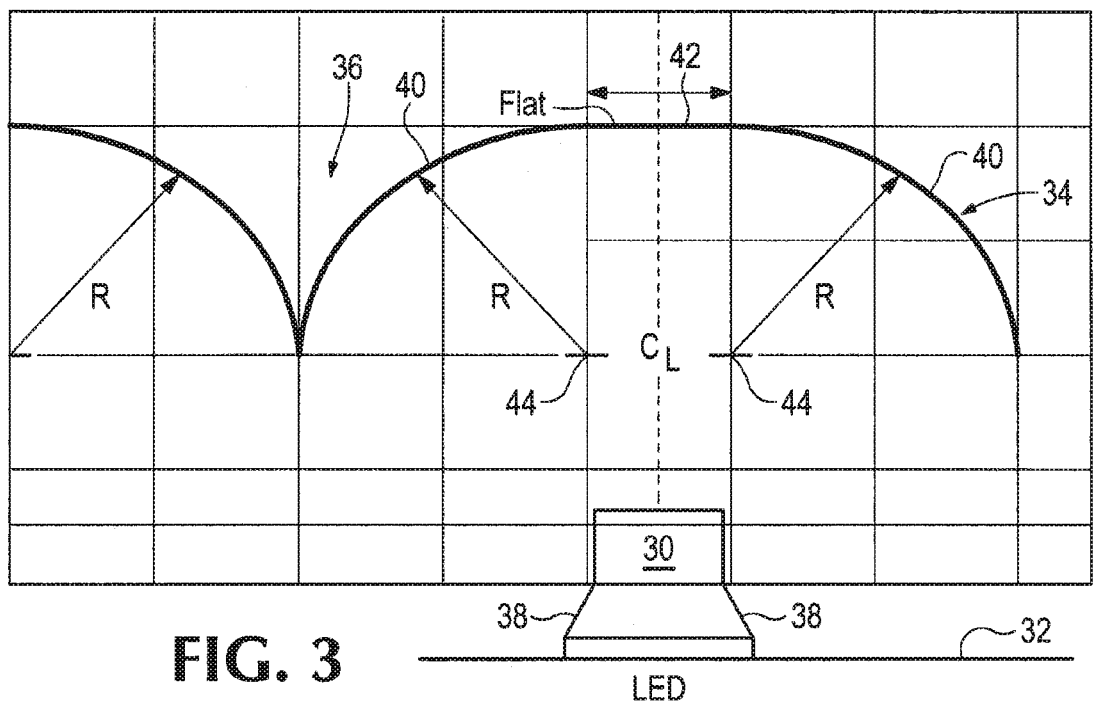
FIG. 3 is a view of a single LED and associated lens in an array with a spherical lens having a compound shape.

More specifically, FIG. 3 shows an LED 30 mounted on a circuit board 32 with an associated lens 34 from an array that may comprise, for example, one thousand (1,000) LED's. Each LED 30 typically emits disparate light from the sides 38 so that the light is widely dispersed. In order to more effectively collect the light, lens 34 is formed of a compound shape that includes a curved surfaces 40 separated by a flat surface 42. Curved surfaces 40 may have a spherical or offset aspheric shape, although in FIG. 3 a spherical surface is shown. Lens 34 is centered about center line $C_L$ extending through LED 30 so that light from each side 38 of LED 30 is projected into the respective curved surface 40 on that side. Each curved surface 40 is centered about a radius R extending from a center point 44. Each radius R extends from center point 44 that lies directly above an imaginary light point source on each side of the LED 30. The location of center point 44 and length of radius R are determined by standard rules for finding a radius of curvature and center point distance for a plano-convex lens. Even though light is emitted along the sides 38 of LED, center point 44 is determined by assuming a point source of light at each side of LED 30. Thus, each side 38 of LED 30 emits light that primarily transmits through what is effectively a plano-convex lens centered over that side 38. The geometry of each spherical surface 40 is optimized for each portion of the LED 30 from which it collects light. In other words, the dimensions of the lens 34 is determined by finding the preferred plano-convex shape for collimating light on one side of the LED (assuming a point source of light) by standard rules known to those skilled in the art. However, each plano-convex shape (curved surface 40) is incorporated into a single lens separated by flat surface 42. This configuration effectively provides half of a lens on one side of the LED 30 and another half of a lens on another side of the LED 30.

Figure 4:
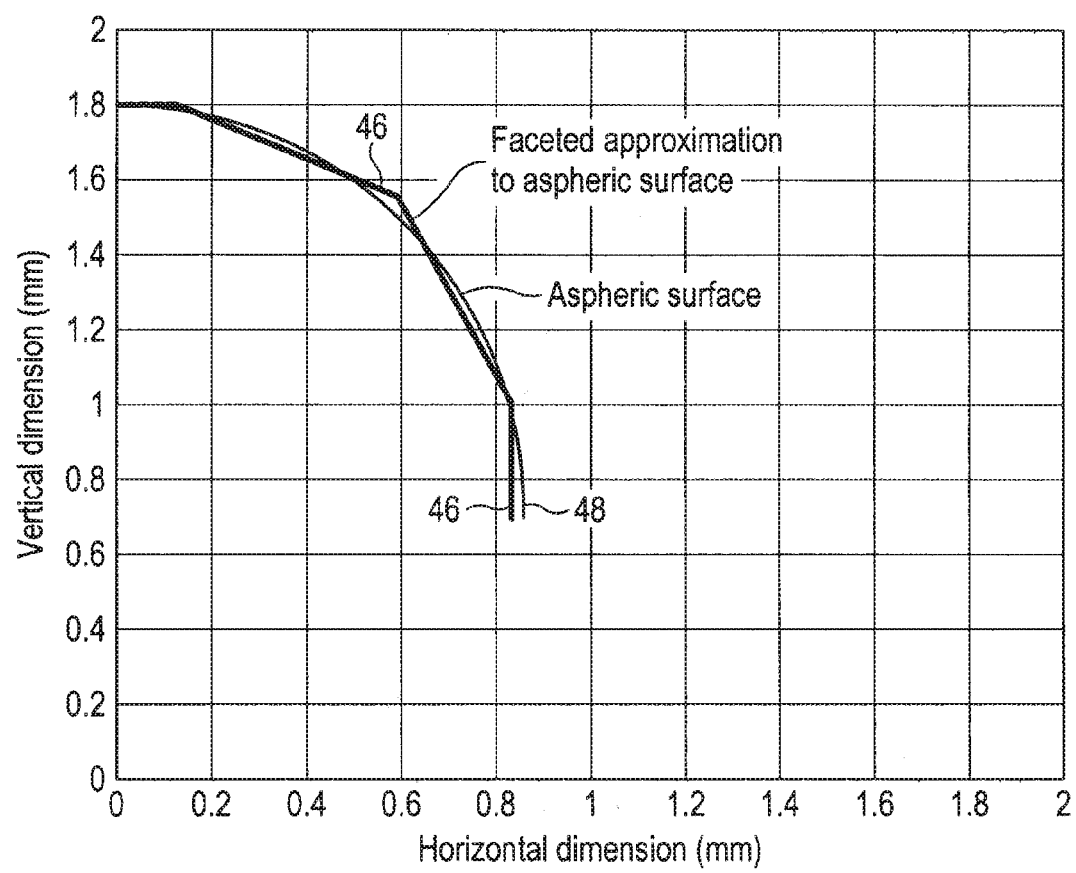
FIG. 4 is a plot showing faceted surfaces approximating an aspheric shape.

Another aspect of this invention uses cut facets 46 to approximate the shape of a curved surface aspheric surface 48 as seen in FIG. 4. Curved or aspheric surface 48 may be determined according to standard lens makers formulas. For example, these formulas calculate the optimal aspheric shape for a collimating optic used with a highly divergent light source, such as an LED. However, for the purposes of collecting light from an LED in non-imaging applications, a precisely and expansively manufactured aspheric lens surface is not needed. Light from an LED may be collected adequately by faceted surfaces 46 that approximate the aspheric surface 48.

Figure 5:
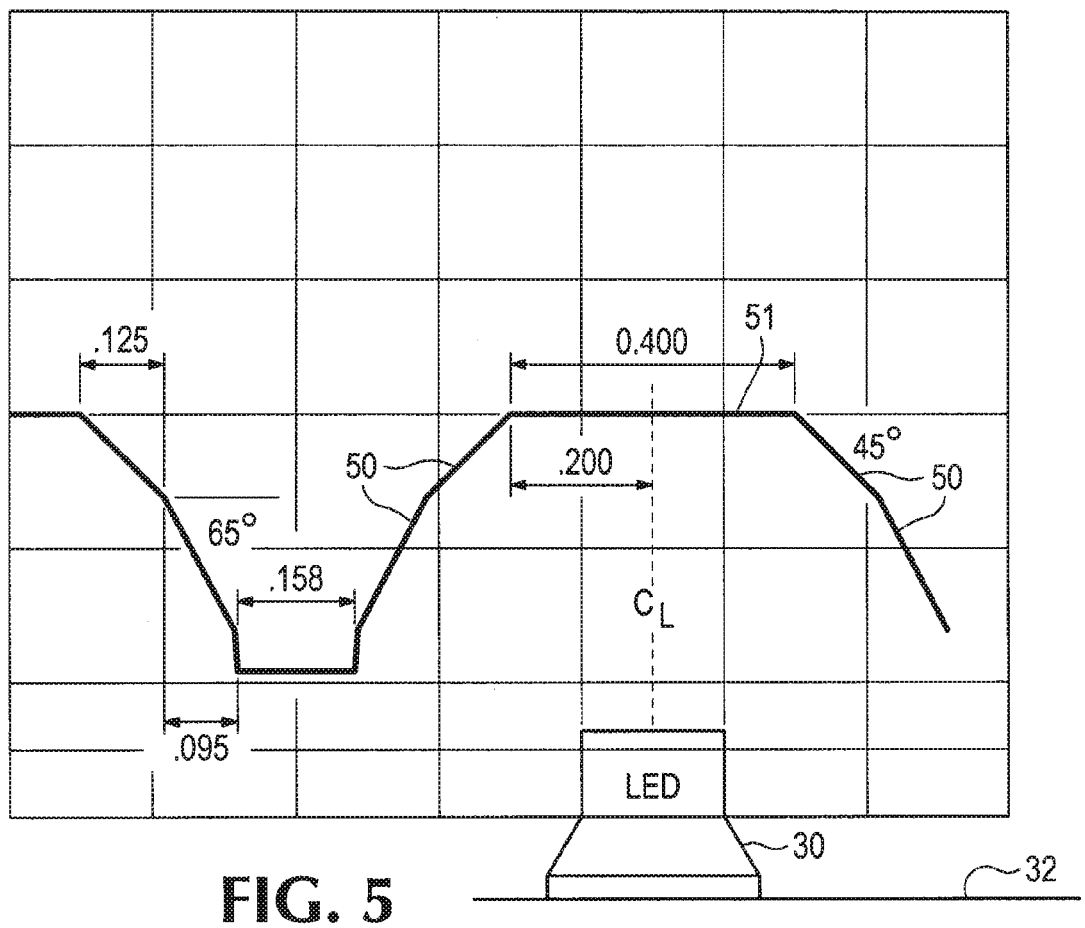
FIG. 5 is a partial cross-section of an LED array having a faceted lens in which the faceted surfaces are circularly symmetrical.

As seen in FIG. 5, faceted surfaces 50 on lens 52 may be formed by a tool or mold into which faceted surfaces 50 are machined by a tool that works like a drill bit, for example. For instance, the facet surfaces may be formed on a drill bit, which is then used to form the mold. The resulting lens may include faceted surfaces 50 that are circularly symmetric as seen in FIG. 5. Faceted surfaces 50 are separated by a flat surface 51. Lens 52 of FIG. 5 includes dimensions that are merely illustrative and are not intended to be limiting.

Figure 6:
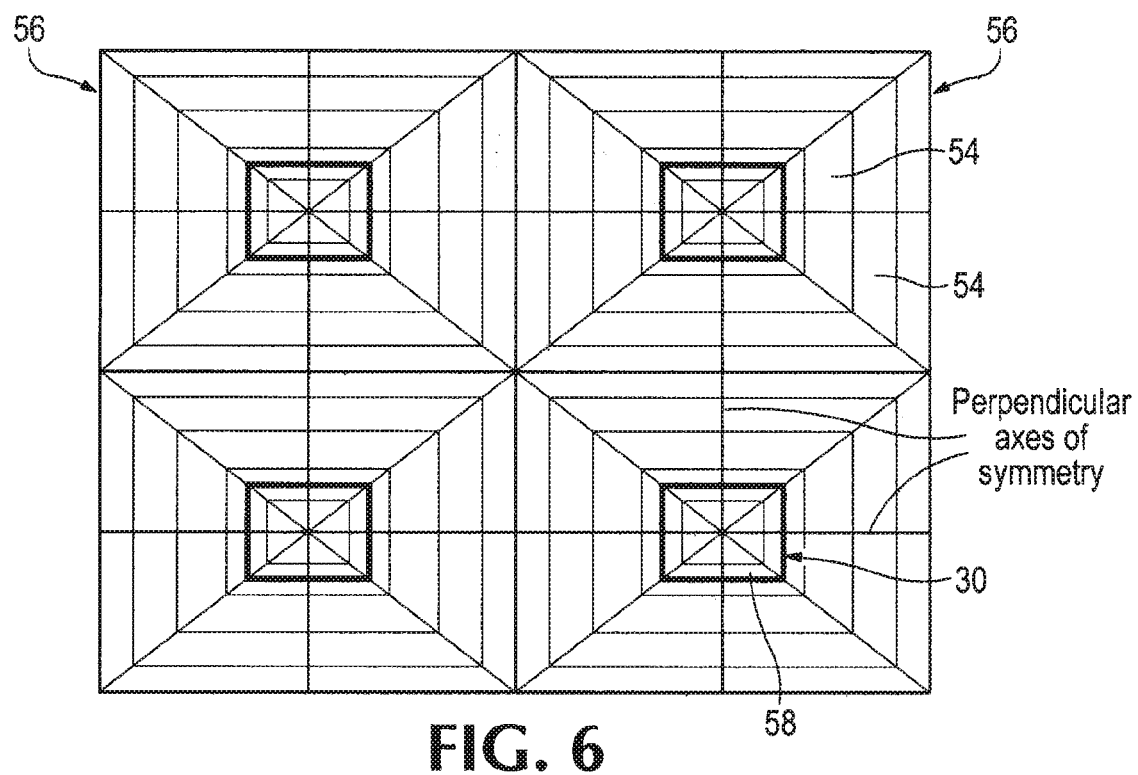
FIG. 6 is a top view of a lens array in which the faceted surfaces are in the form of micro-pyramids forming a square tile pattern.

Alternatively, as seen in FIG. 6, faceted surfaces 54 may be machined in a tool or mold for the lens 56 with, for example, a router or grinder. As seen in FIG. 6, the resulting lens 56 may include faceted surfaces 54 that form micro-pyramids in a square tile pattern that fully fills the surface of each lens 56. Faceted surfaces 54 are formed centrally along perpendicular axes of symmetry. Each square lens 56, for example, may have equal sides having a dimension in the range of about 1 mm to about 1.9 mm. In all the embodiments, the lens encapsulates the LED, which may have a width dimension of, for example, about 0.25 mm Often tools for material removal might also apply, such as water-jet or laser cutting tools.

As seen in FIGS. 5 and 6, the faceted surfaces can accommodate flattened shapes necessitated in this case by the fact that the LED's 30, as seen most clearly in FIG. 6, has faceted sides 58 on either side of its extended width.

The lens array may be formed of a potting gel that is cured within a tool or mold to have the desired configuration. The mold may be metal such as, for example, stainless steel. Alternatively, the lens array may be formed of glass or other material that may be machined to the desired configuration. Furthermore, the number of faceted surfaces may vary according to the desired precision. Additionally, the width of the lens in all embodiments may vary according to a number of factors such as, for example, the grid spacing of the LED's.

Persons skilled in the art will recognize that many modifications and variations are possible in the details, materials, and arrangements of the parts and actions which have been described and illustrated in order to explain the nature of this invention and that such modifications and variations do not depart from the spirit and scope of the teachings and claims contained therein.

The invention claimed is:
1. A lighting module, comprising:
an array of LED light sources on a substrate;
a monolithic structure having multiple lenses for collecting light from the array of multiple LED light sources mounted above the LEDs adjacent the substrate;
wherein each LED light source emits divergent light, wherein for each LED light source there is a lens in the monolithic structure having a first surface with a compound shape of at least two faceted portions separated by a flat portion that is distributable around the LED light source and arranged to collimate the light from the LED, each faceted portion having at least two facets, formed centrally along perpendicular axes of symmetry with other lenses in a square tile pattern; and
wherein each lens approximates a spherical or an aspheric shape relative to its respective LED light source.

2. The lens array of claim 1, wherein the faceted portions are equidistant from a center line of the LED light source and the flat portion is perpendicular to the center line.

3. The lens array of claim 1, wherein each of the offset spherical or aspheric shapes are offset from a center line extending through the each LED light source.

4. The lens array of claim 1, wherein each of the lenses is symmetric about a center line extending through each LED light source.

5. The lens array of claim 1, wherein each of the lenses includes sections that collect light from respective portions of each LED light source.

6. The lens array of claim 5, wherein each lens section is optimized for each portion of each LED light source from which each section collects light.

7. The lens array of claim 1, wherein each of the lenses includes an offset aspheric shape.

8. The lens array of claim 1, wherein the square tile pattern fully fills a surface of each of the lenses.

9. The lens array of claim 1, wherein the square tile pattern is formed from micro-pyramids.

10. A method of manufacturing an LED light module, comprising:
    determining and forming a configuration for an array of lenses so that there is a separate lens for each LED in an array of LEDs on a substrate in a monolithic structure,
    wherein each lens has a first surface having a compound shape including a faceted portion that is distributed around an LED arranged to collimate the light from the LED, and
    wherein each lens having a compound shape that includes faceted portions separated by a flat portion, each faceted portion has at least two facets formed centrally along perpendicular axes of symmetry with other lenses in a square tile pattern,
    the lens being disposed over an LED so that light from each side of the LED is projected into a respective faceted surface, the lenses in the monolithic structure being arranged adjacent the substrate over the array of LEDs.

11. The method of claim 10, wherein forming the lens array by molding of the array of lenses as a monolithic structure.

12. The method of claim 10, wherein each lens in the lens array is fabricated by machining faceted surfaces into the lens array.

13. The method of claim 12, wherein the shape of the lens array is formed by machining a mold using a drill bit-type tool.

14. The method of claim 12, wherein the shape of the lens array is formed by machining a mold using a surface lathe, router, or grinder.

15. The method of claim 14, wherein each lens in the lens array is machined using micro-pyramids in a square tile pattern.

16. The method of claim 11, wherein the lens array is formed by molding potting gel.

17. The method of claim 10, wherein the lens array is formed of glass.

18. The method of claim 10, wherein each lens in the lens array is formed of micro-pyramids in a square tile pattern.

* * * * *